United States Patent
Tsukamoto

(10) Patent No.: US 9,328,411 B2
(45) Date of Patent: May 3, 2016

(54) YTTERBIUM SPUTTERING TARGET AND METHOD OF PRODUCING SAID TARGET

(75) Inventor: Shiro Tsukamoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 1744 days.

(21) Appl. No.: 12/594,492

(22) PCT Filed: Feb. 5, 2009

(86) PCT No.: PCT/JP2009/051931
§ 371 (c)(1),
(2), (4) Date: Oct. 2, 2009

(87) PCT Pub. No.: WO2009/099121
PCT Pub. Date: Aug. 13, 2009

(65) Prior Publication Data
US 2010/0044223 A1 Feb. 25, 2010

(30) Foreign Application Priority Data

Feb. 8, 2008 (JP) .................................. 2008-028631

(51) Int. Cl.
- *C23C 14/34* (2006.01)
- *C22F 1/00* (2006.01)
- *C22F 1/02* (2006.01)
- *C22F 1/16* (2006.01)

(52) U.S. Cl.
CPC ............. *C23C 14/3414* (2013.01); *C22F 1/00* (2013.01); *C22F 1/02* (2013.01); *C22F 1/16* (2013.01)

(58) Field of Classification Search
CPC ......... C23C 14/3414; C22F 1/00; C22F 1/02; C22F 1/16
USPC ................... 204/298.13; 148/559; 420/416
See application file for complete search history.

(56) References Cited

U.S. PATENT DOCUMENTS

| | | | |
|---|---|---|---|
| 5,460,793 A | 10/1995 | Kano et al. | |
| 6,153,315 A | 11/2000 | Yamakoshi et al. | |
| 6,946,039 B1 * | 9/2005 | Segal et al. | 148/400 |
| 2007/0108046 A1 | 5/2007 | Tsukamoto | |
| 2007/0297938 A1 | 12/2007 | Takahashi | |
| 2009/0057139 A1 | 3/2009 | Fukushima et al. | |
| 2009/0071821 A1 | 3/2009 | Takahashi | |
| 2009/0090621 A1 | 4/2009 | Tsukamoto | |
| 2010/0260640 A1 | 10/2010 | Shindo et al. | |

FOREIGN PATENT DOCUMENTS

| | | |
|---|---|---|
| JP | 03-257158 A | 11/1991 |
| JP | 2004-204284 A | 7/2004 |
| JP | 2005-307222 A | 11/2005 |

OTHER PUBLICATIONS

Gschneidner et al., Properties of Pure Metals-Ytterbium-ASM Handbook, 1990, ASM International, vol. 2, p. 1-4.*
ASM Committee, Heat Treating in Vacuum Furnaces and Auxiliary Equipment-ASM Handbook, 1991, ASM International, vol. 4, p. 1 of 1.*

* cited by examiner

Primary Examiner — Roy King
Assistant Examiner — Caitlin Kiechle
(74) Attorney, Agent, or Firm — Howson & Howson LLP

(57) ABSTRACT

Provided is a method of producing an ytterbium sputtering target, wherein an ytterbium target material having Vickers hardness (Hv) of the material surface of 15 or more and 40 or less is prepared in advance, and a surface of the ytterbium target material having the foregoing surface hardness is subject to final finish processing by way of machining. With the ytterbium sputtering target, present invention aims to remarkably reduce the irregularities (gouges) on the target surface after the final finish processing of the target material, and to inhibit the generation of particles during sputtering.

13 Claims, No Drawings

YTTERBIUM SPUTTERING TARGET AND METHOD OF PRODUCING SAID TARGET

BACKGROUND OF THE INVENTION

The present invention relates to an ytterbium sputtering target and a method of producing such a target capable of reducing the irregularities (gouges) existing on the target surface after the final finish processing of such target material.

Ytterbium (Yb) is a rare-earth element, and is contained in the earth's crust as a mixed composite oxide mineral resource. Rare-earth elements are called "rare-earth" elements because they are separated from relatively rare minerals, but they are not that rare in light of the overall earth's crust.

Ytterbium is a gray metal having an atomic number of 70 and an atomic weight of 173.0, and comprises a cubic close-packed structure at normal temperature. Ytterbium has a melting point of 819° C., boiling point of 1194° C., density of 6.97 g/cm$^3$, its surface is oxidized in the atmosphere, and is also soluble in acid. With rare-earth elements, compounds having an oxidation number of 3 are generally stable, and ytterbium is also trivalent, but certain rare-earth elements are bivalent. The present invention covers all of the above.

In recent years, research and development for using ytterbium as an electronic material such as a metal gate material and High-k material are being promoted, and ytterbium is a metal that is attracting attention.

Under normal circumstances, the foregoing electronic material is formed by way of sputtering. Sputtering is a method of applying DC voltage or high-frequency voltage between a substrate and a sputtering target while introducing inert gas (primarily Ar gas) into the vacuum to cause the ionized Ar to collide with the sputtering target, and deposit the discharged target substance onto the substrate.

As a method of producing an ytterbium sputtering target, proposed is a method of cutting a high purity ytterbium ingot into a prescribed size, and grinding and polishing to produce a high purity ytterbium target (for instance, refer to Patent Document 1).

Nevertheless, owing to ytterbium's fragile and soft feature at room temperature, narrow irregularities (gouges) are formed in the vicinity of either side of the surface cut marks when machined chips (mostly thin, linear chips) are separated in bite cutting surface. These irregularities (gouges) are visually recognizable in size, to be more precise, approximately tens of μm to hundreds of μm However, these fine irregularities (gouges) actually cause serious problems. When performing bite cutting, the irregularities (gouges) are crushed pursuant to the bite feed, and leave numerous flaws on the ytterbium target surface. In particular, when the target material is of a high purity, ytterbium at room temperature is so soft that it can be scratched with a human nail, and this will become a serious problem.

Moreover, when forming the target in a disk shape, there is a problem in that fine scratches are left in a concentric pattern on the target surface since the target surface is cut concentrically.

As conventional technology, disclosed is technology of finishing the surface of a W alloy sputtering target to a gloss surface of an extremely small size with minimal irregularities by a machined finish such as grinding to eliminate the work-defect layer containing minute cracks and the like that occur during the machining (for instance, refer to Patent Document 2).

Also disclosed is technology of considerably reducing the particles that are generated during sputtering in a silicide sputtering target by partially eliminating the work-affected layer of the surface and making the surface roughness to be 0.05 to 1.0 μm (for instance, refer to Patent Document 3).

Moreover, disclosed is technology of reducing the generation of particles during sputtering by performing finish processing on the sputtered face by subjecting the sputtering target surface to precision cutting, and selecting the processing conditions to achieve a centerline average roughness of Ra=0.2 μm and a work-affected layer thickness of 15 μm (for instance, refer to Patent Document 4). However, the object of each of the foregoing technologies is to obtain a target having a surface with minimal surface roughness and low processing strain by devising the processing conditions in the machining of the sputtering target surface.

Meanwhile, as an example that focused on controlling the properties of the target surface, disclosed is an invention of making Vickers hardness to be 30 to 80 and keeping the variation thereof to be within 20% in order to prevent the generation of abnormal discharge in a sputtering target having Al as its primary component (for instance, refer to Patent Document 5). Nevertheless, the object of the foregoing invention is to overcome the problems that arise during the sputtering deposition using such a target by controlling the properties after the target surface has been processed, and Patent Document 5 does not offer any object or motive for resolving the "gouges" that arise at the manufacturing stage (surface machining), which is a problem that is unique to a totally different material of an ytterbium target.

The present inventors devised the processing conditions as with the conventional examples in order to inhibit the generation of the foregoing irregularities (gouges); that is, by attempting to adjust the cutting edge angle, cutting edge depth and cutting speed of the bite during the final finish processing. However, even though the irregularities of the gouges came to be smaller by reducing the cutting edge angle and narrowing the cutting edge depth, the result was insufficient.

Specifically, the number of gouges will decrease when the cutting speed is lowered, but the irregularities tend to be larger. Meanwhile, when the cutting speed is increased, there is a problem in that the number of gouges will increase and that the machined chips will ignite. Thus, it was not possible to reliably inhibit the generation of gouges simply by adjusting the bite cutting conditions.

These irregularities (gouges) cause the generation of particles during sputtering. Even assuming that the gouges are ground with a scraper or the like after the machining process and rolling is performing at a pressure of roughly 0.2 mm in order to make the irregularities unnoticeable, this is insufficient in inhibiting the generation of particles and, contrarily, there were cases where the generation of particles increased.

In addition, since ytterbium is a chemically active metal, it easily reacts with the oxygen, moisture and carbon dioxide in the atmosphere. Thus, for example, if finish processing of wet polishing is performed on the target surface, there is a problem in that an oxide film or a carbonized film is formed, contamination from oxygen or carbon or from the abrasive will arise, and plasma cannot be generated when starting the sputtering process.

[Patent Document 1] Japanese Patent Application No. 2007-274808

[Patent Document 2] Japanese Patent Laid-Open Publication No. H3-257158

[Patent Document 3] Japanese Patent Laid-Open Publication No. H6-322529

[Patent Document 4] Japanese Patent Laid-Open Publication No. H11-001766
[Patent Document 5] Japanese Patent Laid-Open Publication No. 2004-204284

SUMMARY OF THE INVENTION

Thus, an object of the present invention is to considerably reduce the irregularities (gouges) on the target surface after the final finish processing of the target material, and inhibit the generation of particles during sputtering in an ytterbium sputtering target.

In order to achieve the foregoing object, as a result of intense study, the present inventors have discovered that the conventional problems described above can be resolved by adjusting the surface hardness of the target material before the final finish processing to be within a prescribed range in an ytterbium sputtering target.

Based on the foregoing discovery, the present invention provides:

1. A method of producing an ytterbium sputtering target, wherein an ytterbium target material surface having Vickers hardness (Hv) of 15 or more and 40 or less is prepared in advance, and surface of the ytterbium target material having the foregoing surface hardness is subject to final finish processing by machining;
2. A method of producing an ytterbium sputtering target, wherein an ytterbium target material surface having Vickers hardness (Hv) of 18 or more and 40 or less is prepared in advance, and a surface of the ytterbium target material having the foregoing surface hardness is subject to final finish processing by machining;
3. The method of producing an ytterbium sputtering target according to paragraph 1 or paragraph 2 above, wherein Vickers hardness (Hv) in a thickness direction of the ytterbium target material is set to −3 or more and 5 or less based on Vickers hardness of the ytterbium target material surface;
4. The method of producing an ytterbium sputtering target according to any one of paragraphs 1 to 3 above, wherein an ytterbium cast ingot is subject to cold rolling, thereafter annealed in a vacuum or an inert gas at 350° C. or higher and 700° C. or lower, and the surface of the obtained ytterbium target material is subject to final finish processing by machining;
5. The method of producing an ytterbium sputtering target according to any one of paragraphs 1 to 4 above, wherein the ytterbium target material has a purity of 3N or higher;
6. The method of producing an ytterbium sputtering target according to any one of paragraphs 1 to 4 above, wherein the ytterbium target material has a purity of 4N or higher; and
7. The method of producing an ytterbium sputtering target according to any one of paragraphs 1 to 6 above, wherein dry cutting work is performed in the final finish processing.

The present invention additionally provides:

8. An ytterbium sputtering target having a purity of 3N or higher and a surface roughness Ra of 5 μm or less;
9. An ytterbium sputtering target having a purity of 4N or higher and a surface roughness Ra of 10 μm or less; and
10. The ytterbium sputtering target according to paragraph 8 or paragraph 9 above, wherein Vickers hardness (Hv) of the ytterbium target surface after the final finish processing is 15 or more and 40 or less.

The ytterbium sputtering target of the present invention yields a superior result of considerably reducing the irregularities (gouges) that occur on the target surface (sputtered face) even when the target material surface is subject to machining, and consequently enabling to inhibit the generation of particles caused by such irregularities (gouges).

DETAILED DESCRIPTION OF THE INVENTION

With an ytterbium sputtering target, by making Vickers hardness (Hv) of the target material surface before the final finish processing to be 15 or more and 40 or less, generation of the foregoing irregularities (gouges) can be considerably reduced even upon machining the target material surface. Consequently, it is possible to reliably inhibit the generation of particles during sputtering. By making Vickers hardness (Hv) of the target material surface to be preferably 18 or more, the generation of irregularities (gouges) can be reduced even further.

If Vickers hardness (Hv) of the foregoing target material surface is less than 15, this is not preferable since the target material surface is soft and sticky and narrow irregularities (gouges) are formed on the overall surface in the vicinity of either side of the surface cut marks when machined chips (mostly thin, linear chips) are separated as a result of machining such target material, and such irregularities (gouges) cause the generation of a considerable amount of particles during sputtering.

Meanwhile, if Vickers hardness (Hv) of the foregoing target material surface exceeds 40, this is not preferable since the fragility of the target material will increase, and minute cracks will be generated from the areas that were subject to bite cutting.

In the final finish processing, if the cutting by machining advances to the inside of the target material, the fragile portion will be exposed due to the softness of the inside of the target material, and, as a result of such portion being cut, numerous irregularities (gouges) will be generated from that portion. Accordingly, even if the thickness direction of the target is concerned, making Vickers hardness to be −3 or more and 5 or less is preferable based on Vickers hardness (Hv) of the surface.

In order to obtain the intended Vickers hardness (Hv) described above, a method of subjecting an ytterbium cast ingot to cold rolling, and performing annealing thereto in a vacuum or inert gas at a temperature of 350° C. or higher and 700° C. or lower can be employed. The annealing temperature of less than 350° C. is not preferable since recrystallization will be insufficient. Meanwhile, the annealing temperature exceeding 700° C. is not preferable either, because a high temperature phase (bcc) will appear and make the composition processing characteristics change the crystal structure to be uneven, and still such high temperature phase will remain.

In the foregoing explanation, the annealing temperature was regulated to adjust Vickers hardness (Hv), and this is an extremely preferable method as described above. Nevertheless, other means may be used to adjust Vickers hardness (Hv). Specifically, if the surface hardness of the foregoing target material is able to achieve the conditions of the present invention, it should be easy to understand that the object of the present invention can be partially achieved.

Meanwhile, high purification of ytterbium is demanded to make use of its characteristics, but ytterbium itself is a fragile and soft metal at room temperature. Thus, the higher purity becomes, the more characteristics of ytterbium tend to increase. In other words, when target material surface using high purity ytterbium is cut, it is likely that more irregularities (gouges) will be generated. Accordingly, the present invention that is free from irregularities (gouges) is particularly effective in high purity ytterbium having a purity of 3N or higher, and even 4N or higher.

In addition, since ytterbium is a chemically active metal and easily reacts with the oxygen in the atmosphere, there is a problem in that an oxide film will be formed on the target surface when finish processing of wet polishing, for example, is performed thereon. It is desirable to eliminate such contamination as oxide film as much as possible. Thus, in the present invention, it is particularly effective to use dry cutting work in the final finish processing of the target material surface.

In the method of producing an ytterbium sputtering target according to the present invention, by adjusting Vickers hardness (Hv) of the target material surface to be 15 or more and 40 or less, it is possible to obtain a target surface (sputtered face) having a surface roughness (Ra) 5 µm or less when the purity is 3N or higher, and a surface roughness (Ra) 10 µm or less when the purity is 4N or higher.

[Examples]

The present invention is now explained in detail with reference to the Examples. These Examples are merely illustrative, and the present invention shall in no way be limited thereby. In other words, various modifications and other embodiments based on the technical spirit claimed in the claims shall be included in the present invention as a matter of course.

(Examples 1 to 4)

An ytterbium target material having a thickness of 10 mm and a diameter of 150 mm was obtained by subjecting an ytterbium cast ingot (diameter of 100 mm) having a purity of 4N to cold rolling, and by additionally annealing in a vacuum or inert gas at the temperature from 350° C. to 700° C. for 1 hour.

The achieving annealing temperature was regulated to change Vickers hardness before the finish processing incidentally, although Vickers hardness will be uneven if the annealing time is short, there is no particular problem if the annealing time is 1 hour or longer.

Subsequently, dry cutting work was performed with a lathe to finish the ytterbium target material surface. The processing was performed in the following conditions which are deemed optimal. Incidentally, the present invention is not limited in any way by the following processing conditions.

Work rotation speed: 100 rpm
Bite angle: 45°
Bite feeding speed: 0.1 mm/rpm
Final cutting depth: 0.07 mm The ytterbium target that had the surface finish processing in the foregoing conditions was sputtered, and the status of the generation of initial particles was examined. The results are shown in Table 1.

TABLE 1

|  | Purity | Hardness (Hv) | Hardness Distribution in Thickness Direction | Number of Generated Particles (/cm$^2$) | Generation of Gouges | Surface Roughness(Ra) (µm) | Overall Evaluation |
|---|---|---|---|---|---|---|---|
| Example 1 | 4N | 15 | 12 to 16 | 14 | 1/face | 7.8 | Favorable |
| Example 2 | 4N | 18 | 16 to 23 | 12 | None | 3.8 | Optimal |
| Example 3 | 4N | 25 | 19 to 25 | 11 | None | 2.5 | Optimal |
| Example 4 | 4N | 36 | 33 to 38 | 8 | None | 1.5 | Optimal |
| Example 5 | 4N | 27 | Surface hardened | 34 | 7/face | 8.1 | pass |
| Example 6 | 4N | 19 | Surface hardened | 29 | 5/face | 9.2 | pass |
| Example 7 | 3N | 20 | 19 to 32 | 15 | 1/face | 2.4 | Favorable |
| Example 8 | 3N | 31 | 28 to 33 | 12 | None | 1.6 | Optimal |
| Comparative Example 1 | 4N | 11 | 10 to 12 | 87 | Generated overall | 17.5 | No good |
| Comparative Example 2 | 3N | 13 | 11 to 14 | 147 | Generated overall | 12.3 | No good |

The number of particles was counted for particles of 0.5 µm or larger.
The hardness is of the target material before surface finishing.

In Example 1, an ytterbium target material having a hardness distribution in the thickness direction of the target was 12 to 16 was obtained in that Vickers hardness (Hv) of the material surface before the finish processing was 15, which was within the range of the present invention. When this target material was subject to final finish processing, favorable results were obtained with few irregularities (gouges) on the target surface, uniform surface, and low generation of particles during sputtering.

In Example 2, an ytterbium target material having a hardness distribution in the thickness direction of the target was 16 to 23 was obtained in that Vickers hardness (Hv) of the material surface before the finish processing was 18, which was within the range of the present invention. When this target material was subject to final finish processing, optimal results were obtained with virtually no irregularities (gouges) on the target surface, uniform surface, and low generation of particles during sputtering.

In Example 3, an ytterbium target material having a hardness distribution in the thickness direction of the target was 19 to 25 was obtained in that Vickers hardness (Hv) of the material surface before the finish processing was 25, which was within the range of the present invention. When this target material was subject to final finish processing, optimal results were obtained with virtually no irregularities (gouges) on the target surface, uniform surface, and low generation of particles during sputtering.

In Example 4, an ytterbium target material having a hardness distribution in the thickness direction of the target was 33 to 38 was obtained in that Vickers hardness (Hv) of the material surface before the finish processing was 36, which was within the range of the present invention. When this target material was subject to final finish processing, optimal results were obtained with virtually no irregularities (gouges) on the target surface, uniform surface, and low generation of particles during sputtering.

Based on the foregoing results, even when surface finish processing was performed on the surface of an ytterbium target material having a purity of 4N, Vickers hardness (Hv) of the material surface being 15 or more and 40 or less, and a hardness distribution being −3 or more and 5 or less in the thickness direction of the target based on Vickers hardness of the material surface, superior results were obtained with few or virtually no irregularities (gouges) on the target surface, and low generation of particles during sputtering.

(Examples 5 and 6)

In Examples 5 and 6, the target material was prepared with the same method as Examples 1 to 4. With the achieving annealing temperature set at 700° C., a target material was obtained in that only the surface thereof was hardened by way of the shot peening and was subject to dry cutting work with a lathe. The obtained target material had a thickness of 10 mm and a diameter of 150 mm.

Here, shot peening refers to the cold working method of accelerating and injecting hard pellets called shot material having a grain size of roughly 40 μm to 1.3 mm using a projection device, and causing such shot material to collide with a machined part at high speed. The machined part that was subject to shot peening will have a surface with roughness to some extent, but the surface part will be subject to work hardening and yield high compressive residual stress.

The processing conditions were the same as the conditions of Examples 1 to 4. Incidentally, the present invention is not limited in any way by the following processing conditions.

Work rotation speed: 100 rpm
Bite angle: 45°
Bite feeding speed: 0.1 mm/rpm
Final cutting depth: 0.07 mm The ytterbium target that had the surface finish processing in the foregoing conditions was sputtered, and the status of the generation of initial particles was examined. The results are shown in Table 1.

In Example 5, an ytterbium target material was obtained in that Vickers hardness (Hv) of the material surface before the finish processing was 27, which was within the range of the present invention, and only the surface thereof was hardened. When this target material was subject to final finish processing, the results were within a practical range regardless of some irregularities (gouges) on the target surface, slightly coarse surface, and more generation of particles during sputtering in comparison to Examples 1 to 4.

In Example 6, an ytterbium target material was obtained in that Vickers hardness (Hv) of the material surface before the finish processing was 19, which was within the range of the present invention, and only the surface thereof was hardened. When this target material was subject to final finish processing, the results were within a practical range, though there were some irregularities (gouges) on the target surface, slightly coarse surface, and generation of more particles during sputtering compared with Examples 1 to 4.

Based on the foregoing results, with an ytterbium target material having a purity of 4N, even Vickers hardness (Hv) of material surface is 15 or more and 40 or less, an ytterbium target material in that only the surface thereof was hardened was able to reduce the generation of irregularities (gouges), but unable to eliminate irregularities (gouges) completely. Nevertheless, the number of particles that were generated in sputtering in Examples 5 and 6 was within a practically usable range.

(Examples 7 and 8)

An ytterbium cast ingot (diameter of 100 mm) having a purity of 3N was subject to cold rolling, and additionally annealed in a vacuum or inert gas at the temperature from 350° C. to 700° C. for 1 hour to obtain an ytterbium target material having a thickness of 10 mm and a diameter of 150 mm.

Vickers hardness before the finish processing was adjusted by regulating the achieving annealing temperature. Incidentally, Vickers hardness of material surface will be uneven when the annealing time is short; however, there is no particular problem when the annealing time is 1 hour or longer.

Subsequently, dry cutting work was performed with a lathe to finish the ytterbium target material surface. The processing conditions were the following conditions which are deemed optimal. Incidentally, the present invention is not limited in any way by the following processing conditions.

Work rotation speed: 100 rpm
Bite angle: 45°
Bite feeding speed: 0.1 mm/rpm
Final cutting depth: 0.07 mm The ytterbium target that had the surface finish processing in the foregoing conditions was sputtered, and the status of the generation of initial particles was examined. The results are shown in Table 1.

In Example 7, an ytterbium target material having a hardness distribution in the thickness direction of the target was 19 to 32 was obtained in that Vickers hardness (Hv) of the material surface before the finish processing was 20, which was within the range of the present invention. When this target material was subject to final finish processing, favorable results were obtained with few irregularities (gouges) on the target surface, uniform surface, and low generation of particles during sputtering.

In Example 8, an ytterbium target material having a hardness distribution in the thickness direction of the target was 28 to 33 was obtained in that Vickers hardness (Hv) of the material surface before the finish processing was 31, which was within the range of the present invention. When this target material was subject to final finish processing, optimal results were obtained with virtually no irregularities (gouges) on the target surface, uniform surface, and low generation of particles during sputtering.

Based on the foregoing results, with an ytterbium target material having a purity of 3N, Vickers hardness (Hv) of the material surface being 15 or more and 40 or less, and a hardness distribution being −3 or more and 5 or less in the thickness direction of the target based on Vickers hardness of the surface, superior results were obtained with few irregularities (gouges) on the target surface, and low generation of particles during sputtering even if surface finish processing was performed.

(Comparative Examples 1 and 2)

An ytterbium target material having a purity of 4N as Comparative Example 1 and an ytterbium target material having a purity of 3N as Comparative Example 2 were cut from a dissolved and cast ingot, and thereafter subject to dry cutting work with a lathe to finish the target surface. The processing was performed in the following conditions which are deemed optimal.

Work rotation speed: 100 rpm
Bite angle: 45°
Bite feeding speed: 0.1 mm/rpm
Final cutting depth: 0.07 mm The ytterbium target that had the surface finish processing in the foregoing conditions was sputtered, and the status of the generation of initial particles was examined. The results are shown in Table 1.

In Comparative Example 1, Vickers hardness (Hv) of the material surface before the finish processing was 11, which was outside the range of the present invention, and an ytterbium target material having a hardness distribution of 10 to 12 in the thickness direction of the target was obtained. When this target material was subject to final finish processing, irregularities (gouges) were formed on the entire target surface, and the generation of particles during sputtering was extremely high.

In Comparative Example 2, Vickers hardness (Hv) of the material surface before the finish processing was 13, which was outside the range of the present invention, and an ytterbium target material having a hardness distribution of 11 to 14 in the thickness direction of the target was obtained. When this target material was subject to final finish processing, as with Comparative Example 1, irregularities (gouges) were formed on the entire target surface, and the generation of particles during sputtering was extremely high.

Based on the foregoing results, with an ytterbium target material having a purity of 3N and 4N in that Vickers hardness (Hv) of the material surface is outside the range of the present invention of 15 or more and 40 or less, when surface finish processing was performed thereon, the generation of irregularities (gouges) on the entire target surface became prominent, the generation of particles during sputtering was extremely high, and was unsuitable for practical use.

With the ytterbium sputtering target according to the present invention, even if the sputtering material is subject to final finish processing, irregularities (gouges) is hardly formed on the surface, and, consequently, it is possible to significantly reduce the generation of particles during sputtering.

Accordingly, the present invention yields a superior effect of efficiently and stably providing a metal gate thin film having ytterbium as its primary component which is obtained by using the ytterbium sputtering target.

The invention claimed is:

1. A method of producing an ytterbium sputtering target, wherein, in advance of final finish processing, an ytterbium material for forming the ytterbium sputtering target is processed such that a surface of the ytterbium material is provided with a Vickers hardness (Hv) of 15 or more and 40 or less, and thereafter the surface of the ytterbium material is subjected to the final finish processing by machining.

2. A method according to claim 1, wherein the ytterbium material for forming the ytterbium sputtering target is processed such that Vickers hardness (Hv) measured at a location under the surface of the ytterbium material is −3 or more and 5 or less relative to the Vickers hardness of the surface of the ytterbium material.

3. A method according to claim 1, wherein an ytterbium cast ingot is subjected to cold rolling to form a rolled sheet, thereafter the rolled sheet is annealed in a vacuum or an inert gas at 350° C. or higher and 700° C. or lower, and a surface of the annealed sheet is subjected to the final finish processing by machining.

4. A method according to claim 1, wherein the ytterbium material consists of ytterbium and unavoidable impurities, and wherein the ytterbium material has a purity of 3N or higher.

5. A method according to claim 1, wherein the ytterbium material consists of ytterbium and unavoidable impurities, and wherein the ytterbium material has a purity of 4N or higher.

6. A method according to claim 1, wherein dry cutting work is performed in the final finish processing.

7. A method of producing an ytterbium sputtering target, wherein, in advance of final finish processing, an ytterbium material for forming the ytterbium sputtering target is processed such that a surface of the ytterbium material is provided with a Vickers hardness (Hv) of 18 or more and 40 or less, and thereafter the surface of the ytterbium material is subjected to the final finish processing by machining.

8. A method of producing an ytterbium sputtering target according to claim 7, wherein the ytterbium material for forming the ytterbium sputtering target is processed such that Vickers hardness (Hv) measured at a location under the surface of the ytterbium material is −3 or more and 5 or less relative to the Vickers hardness of the surface of the ytterbium material.

9. A method of producing an ytterbium sputtering target according to claim 8, wherein an ytterbium cast ingot is subjected to cold rolling to form a rolled sheet, thereafter the rolled sheet is annealed in a vacuum or an inert gas at 350° C. or higher and 700° C. or lower, and a surface of the annealed sheet is subjected to the final finish processing by machining.

10. A method of producing an ytterbium sputtering target according to claim 9, wherein the ytterbium material consists of ytterbium and unavoidable impurities, and wherein the ytterbium material has a purity of 3N or higher.

11. A method of producing an ytterbium sputtering target according to claim 9, wherein the ytterbium material consists of ytterbium and unavoidable impurities, and wherein the ytterbium material has a purity of 4N or higher.

12. A method of producing an ytterbium sputtering target according to claim 9, wherein dry cutting work is performed in the final finish processing.

13. A method according to claim 7, wherein dry cutting work is performed in the final finish processing.

* * * * *